(12) United States Patent
Balakrishnan et al.

(10) Patent No.: US 10,056,379 B1
(45) Date of Patent: Aug. 21, 2018

(54) LOW VOLTAGE (POWER) JUNCTION FET WITH ALL-AROUND JUNCTION GATE

(71) Applicant: International Business Machines Corporation, Armonk, NY (US)

(72) Inventors: Karthik Balakrishnan, White Plains, NY (US); Bahman Hekmatshoartabari, White Plains, NY (US); Alexander Reznicek, Troy, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/662,874

(22) Filed: Jul. 28, 2017

(51) Int. Cl.
| | |
|---|---|
| *H01L 29/808* | (2006.01) |
| *H01L 27/092* | (2006.01) |
| *H01L 27/112* | (2006.01) |
| *H01L 27/06* | (2006.01) |
| *H01L 27/098* | (2006.01) |
| *H01L 29/08* | (2006.01) |
| *H01L 29/06* | (2006.01) |

(52) U.S. Cl.
CPC ...... *H01L 27/0922* (2013.01); *H01L 27/0629* (2013.01); *H01L 27/098* (2013.01); *H01L 27/11273* (2013.01); *H01L 29/0653* (2013.01); *H01L 29/0891* (2013.01)

(58) Field of Classification Search
CPC ............... H01L 29/8083; H01L 29/66909
See application file for complete search history.

(56) References Cited

U.S. PATENT DOCUMENTS

2016/0293602 A1* 10/2016 Liu .................. H01L 27/098

OTHER PUBLICATIONS

Wikipedia, "JFET," https://en.wikipedia.org/wiki/JFET, Jul. 24, 2017, 5 pages.

* cited by examiner

*Primary Examiner* — Thomas L Dickey
(74) *Attorney, Agent, or Firm* — Louis J. Percello; Ryan, Mason & Lewis, LLP

(57) ABSTRACT

A method for manufacturing a semiconductor device comprises forming a bottom source/drain region on a semiconductor substrate, forming a channel region extending vertically from the bottom source/drain region, growing a top source/drain region from an upper portion of the channel region, and growing a gate region from a lower portion of the channel region under the upper portion, wherein the gate region is on more than one side of the channel region.

13 Claims, 19 Drawing Sheets

100

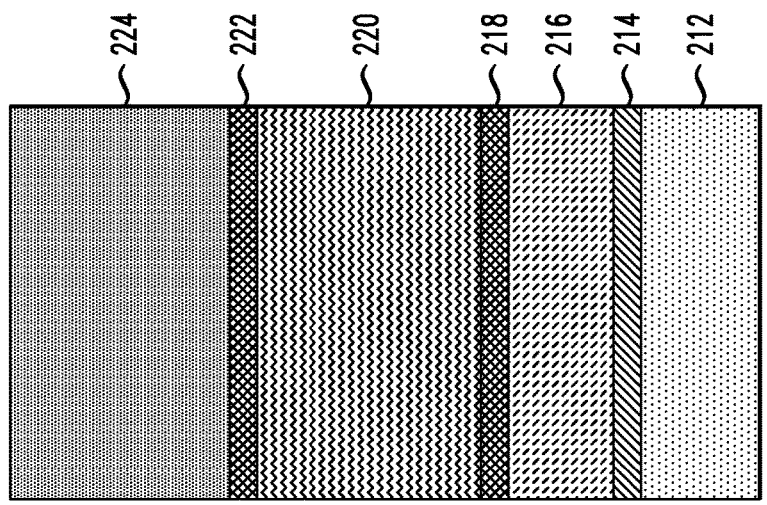
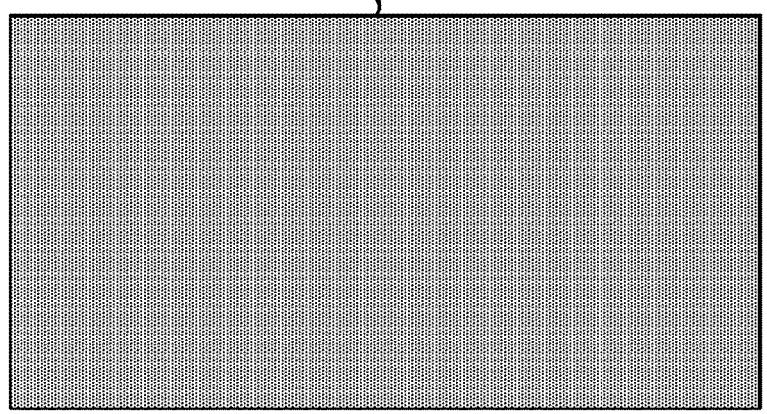

200

200

200

200

200

200

200

200

200

200

200

200

200

200

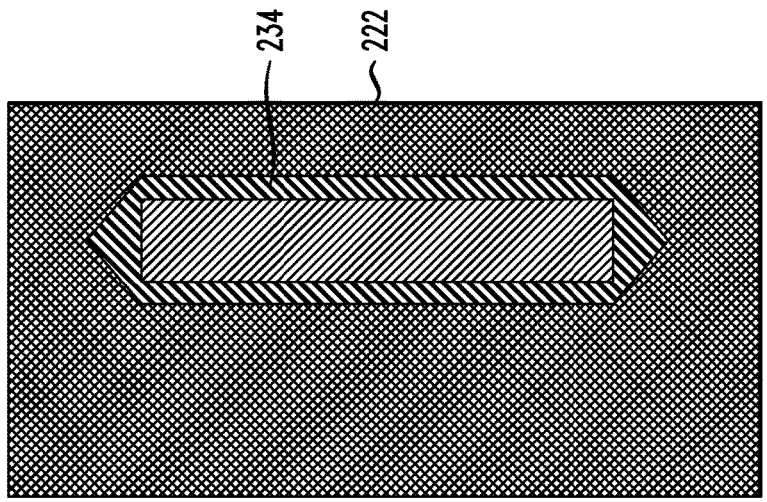
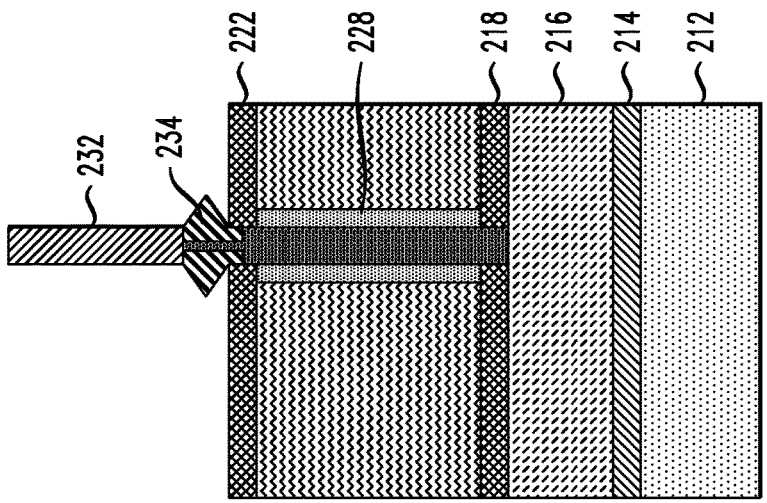
FIG. 10A
200
FIG. 10B
200

200

200

200

200

200

200

200

200

200

200

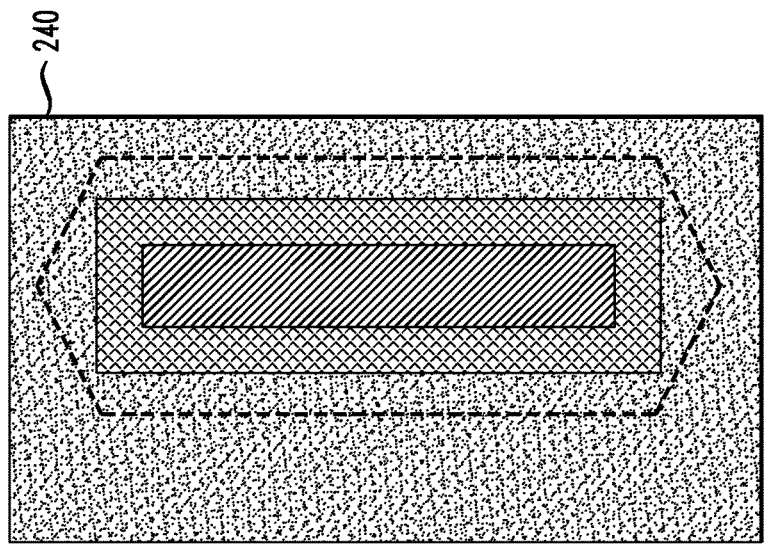
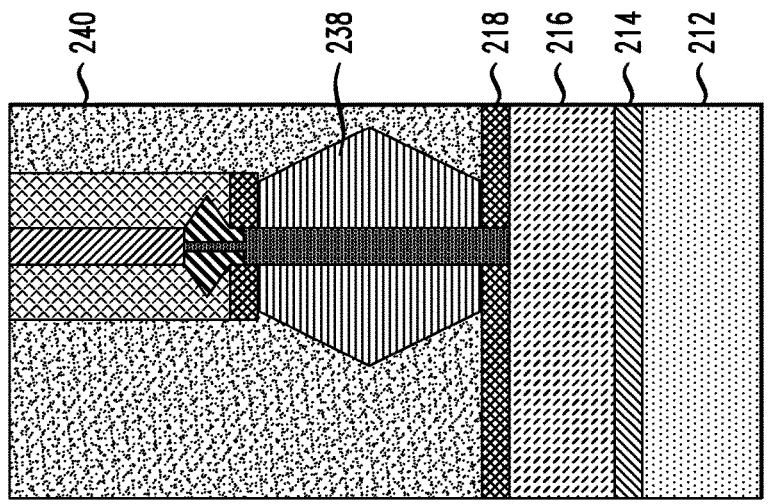

200

200

LOW VOLTAGE (POWER) JUNCTION FET WITH ALL-AROUND JUNCTION GATE

BACKGROUND

Junction field-effect transistors (FETs) are semiconductor devices which exhibit low noise and high input impedance. As a result, junction FETs can be useful in such devices as low noise ring oscillators, as well as memory devices. The properties of junction FETs may also be useful for implementing operational amplifiers with high input-impedance and/or very high current-gain. Operational amplifiers can be viewed as essential building blocks of analog electronics. Low noise has also been deemed to be a critical factor in analog electronics, particularly in high precision computation.

Emerging mobile and Internet of Things (IoT) applications require low power devices. Larger battery driven IoT devices can also benefit from low noise and high input impedance while running on low voltage for certain applications.

There is also a renewed interest in the analog implementation of neural networks, which may be highly beneficial given efficient/low-power implementation of cognitive tasks such as pattern recognition and natural language processing.

There is a need, therefore, for an improved junction FET providing low noise and high input impedance that operates with a relatively low voltage.

SUMMARY

Illustrative embodiments of the invention provide a low voltage junction FET with an all-around junction gate, and techniques for fabricating the same.

According to an exemplary embodiment of the present invention, a method for manufacturing a semiconductor device comprises forming a bottom source/drain region on a semiconductor substrate, forming a channel region extending vertically from the bottom source/drain region, growing a top source/drain region from an upper portion of the channel region, and growing a gate region from a lower portion of the channel region under the upper portion, wherein the gate region is on more than one side of the channel region.

According to an exemplary embodiment of the present invention, a semiconductor device comprises a substrate, a bottom source/drain region on the substrate, a channel region extending vertically from the bottom source/drain region, a top source/drain region extending from an upper portion of the channel region, and a gate region extending from a lower portion of the channel region under the upper portion, wherein the gate region is on more than one side of the channel region.

According to an exemplary embodiment of the present invention, a method for manufacturing a vertical junction field-effect transistor (FET) comprises forming a bottom source/drain region on a semiconductor substrate; forming a channel region extending vertically from the bottom source/drain region; forming a top source/drain region extending from an upper portion of the channel region; and forming a gate region extending from a lower portion of the channel region under the upper portion; wherein the gate region is on more than one side of the channel region; wherein the channel and the top and bottom source/drain regions comprise a first type of doping; and wherein the gate region comprises a second type of doping different from the first type of doping.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIGS. 2A and 2B are schematic cross-sectional and top views, respectively, illustrating manufacturing of a junction FET and showing formation of a bottom source/drain region and sacrificial layer, according to an embodiment of the invention.

FIGS. 10A and 10B are schematic cross-sectional and top views, respectively, illustrating manufacturing of a junction FET and showing formation of a top source/drain region, according to an embodiment of the invention.

FIGS. 16A and 16B are schematic cross-sectional and top views, respectively, illustrating manufacturing of a junction FET and showing formation of an inter-layer dielectric (ILD) layer, according to an embodiment of the invention.

DETAILED DESCRIPTION

Figure 1:
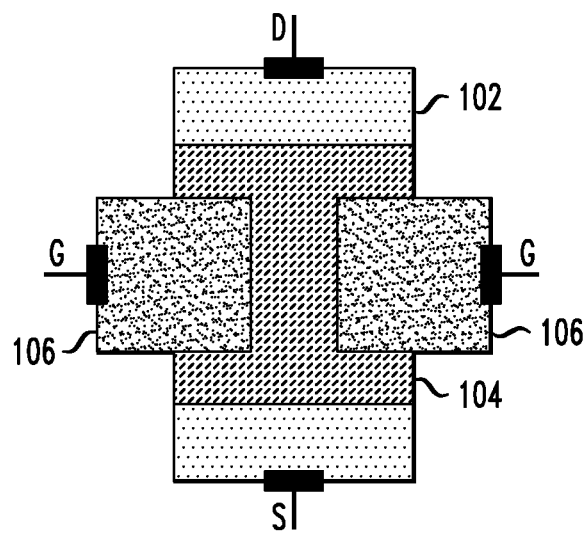
FIG. 1 is a schematic cross-sectional view of a junction FET structure having a gate on both sides of a channel, according to an embodiment of the invention.

In illustrative embodiments, junction FETs and techniques for fabricating the junction FETs are provided. More particularly, illustrative embodiments relate to vertical junction FETS with dual-, tri- or all-around junction gates, which, with respect to conventional structures, effectively cut the voltage requirement to control the junction in half or less. By having a gate on both sides of a channel only half (or less, due to tri- or all-around gate structures) of the voltage when compared with a single gate structure, is needed to turn the current flow on or off in the junction FET. This enables low power/lower voltage applications of junction FETs.

Vertical FET (VFET) devices include channels (e.g., fin channels) with source/drain regions at ends of the channels on top and bottom sides of the channel regions. Current runs through the channels in a vertical direction (e.g., perpendicular to a substrate), for example, from a bottom source/drain region to a top source/drain region.

It is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount.

In the figures, the illustrated scale of one layer, structure, and/or region relative to another layer, structure, and/or region is not necessarily intended to represent actual scale. One or more layers and/or regions of a type commonly used in, for example, a junction FET, a complementary metal-oxide semiconductor (CMOS), nanowire FET, fin field-effect transistor (FinFET), metal-oxide-semiconductor field-effect transistor (MOSFET), vertical FET (VFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, junction FETs, VFETs, nanowire FETs, CMOSs, MOSFETs and/or FinFETs. By way of non-limiting example, the semiconductor devices can include, but are not limited to junction FET, VFET, nanowire FET, CMOS, MOSFET and FinFET devices, and/or semiconductor devices that use junction FET, CMOS, MOSFET, VFET, nanowire FET, and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the cross-sectional views measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

FIG. 1 is a schematic cross-sectional view of a junction FET 100 having a gate 106 on both sides of a channel 102, according to an embodiment of the invention. Junction FET 100 comprises the channel region 102, a depletion region 104, and the gate region 106 formed on at least two sides of the junction FET structure. The junction FET 100 may be a p-channel junction FET or an n-channel junction FET dependent on the doping of the channel and gate semiconductor materials. For example, in a p-channel junction FET, the semiconductor material forming the channel region 102 is doped as p-type, while the gate semiconductor material forming the gate region 106 is doped as n-type. In an n-channel junction FET, the semiconductor material forming the channel region 102 is doped as n-type, while the gate semiconductor material forming the gate region 106 is doped as p-type.

The depletion layer 104 is an insulating layer formed between both pn junctions of the gate on the left and the channel, and the gate on the right and the channel. Advantageously, by having a gate on both sides of the channel, only half of the voltage is needed to turn off the current flow between the source (S) and drain (D). In a structure having an all-around gate, wherein the gate completely surrounds the channel, even less voltage may be required to control the current. A width of the depletion layer 104 is a function of the gate-to-source bias voltage. As the bias voltage increases, the depletion region becomes wider, pinching off the channel region. Junction FET 100 comprises ohmic contacts for the drain (D) and source (S) connections at opposite ends of the channel region, and an ohmic contact to the gate (G) connections.

FIGS. 2A and 2B are schematic cross-sectional and top views, respectively, illustrating manufacturing of a junction FET and showing formation of a bottom source/drain region and sacrificial layer, according to an embodiment of the invention. For the purpose of clarity, illustration of some fabrication steps leading up to the production of the semiconductor structure 200 as illustrated in FIGS. 2A and 2B have been omitted.

Semiconductor structure 200 in FIG. 2A is shown having a vertical structure comprising a substrate 212. In one embodiment, a semiconductor substrate 212 includes semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or other like semiconductor. In addition, multiple layers of the semiconductor materials can be used as the semiconductor material of the substrate. The semiconductor substrate 212 can be a bulk substrate or a silicon-on-insulator (SOI) substrate including a buried insulating layer, such as, for example, a buried oxide or nitride layer.

Formed on substrate 212 is a counter-doped layer 214. The counter-doped layer 214 can be formed by a punch-through stop (PTS) doping process to create the counter-doped layer 214 having a PTS doped region. The counter-doped layer 214 comprises, for example, doped silicon and is doped differently (i.e., opposite doping of source/drain doping) from the source/drain region (e.g., heavily doped source/drain layer 216) in order to prevent leakage current. For example, in a non-limiting illustrative example, the doping of the counter-doped layer 214 uses, for example, arsenic (As) or phosphorous (P) for p-type and boron (B) for n-type, at concentrations in the general range of $5e18/cm^3$ to $5e19/cm^3$ to stop the leakage. A thickness of the counter-doped layer 214 can be approximately 10 nm to about 100 nm.

A heavily doped source/drain layer 216 is epitaxially grown on counter-doped layer 214. The heavily doped source/drain layer 216 can be formed by a bottom-up epitaxial growth process, wherein the heavily doped source/drain layer 216 is grown to certain height (thickness) such as, but not necessarily limited to from about 50 nm to about 250 nm, with about 100 nm to about 200 nm preferred. The epitaxially grown source/drain layer 216 can be doped using processes, such as, for example, ion implantation, in situ, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $e20/cm^3$ to $e21/cm^3$, with $4e20/cm^3$ to $1e21/cm^3$ preferred. The source/drain layer 216 can include, but is not necessarily limited to, silicon (Si), silicon germanium (SiGe), or other semiconductor material.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a PECVD apparatus. A number of different sources may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, ldisilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking.

By "in-situ" it is meant that the dopant that dictates the conductivity type of doped layer is introduced during the process step, e.g., epitaxial deposition, that forms the doped layer.

A bottom spacer layer 218 is then deposited on heavily doped source/drain layer 216. The spacer layer 218 includes, but is not necessarily limited to, low-K dielectric layers, including, but not necessarily limited to, a nitride, such as, SiBCN, SiOCN, or SiN, deposited using, for example, directional deposition techniques, including, but not necessarily limited to high density plasma (HDP) deposition and gas cluster ion beam (GCIB) deposition, or deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

A sacrificial placeholder layer 220, comprising for example, amorphous silicon (a-Si), is deposited on the bottom spacer layer 218 using, for example, deposition techniques including, but not limited to, CVD, PECVD, RFCVD, PVD, ALD, MLD, MBD, PLD, LSMCD, and/or sputtering. A top spacer layer 222 is deposited on the top surface of sacrificial layer 220, followed by an oxide layer 224 on the top spacer layer 222. The top spacer layer 222 includes, but is not necessarily limited to, low-K dielectric layers, including, but not necessarily limited to, a nitride, such as, SiBCN, SiOCN, SiN or SiO$_2$, deposited using, for example, directional deposition techniques, including, but not necessarily limited to high density plasma (HDP) deposition and gas cluster ion beam (GCIB) deposition, or deposition techniques including, but not limited to, CVD, PECVD, RFCVD, PVD, ALD, MLD, MBD, PLD, LSMCD, and/or sputtering.

Figure 3B:
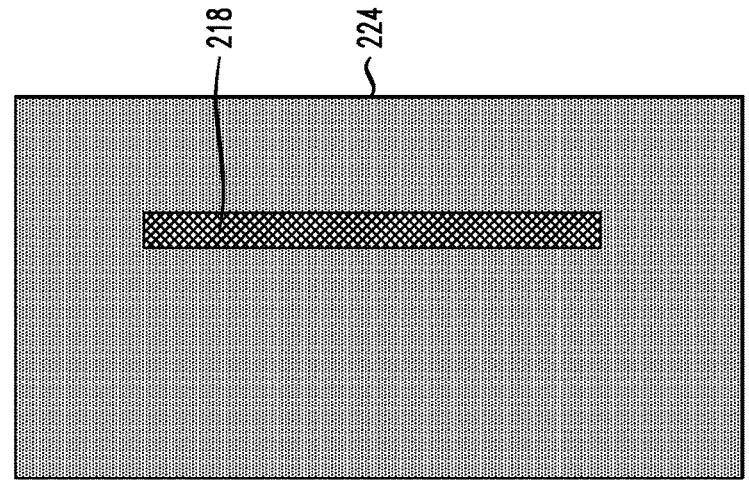
FIGS. 3A and 3B are schematic cross-sectional and top views, respectively, illustrating manufacturing of a junction FET and showing removal of certain layers down to a bottom spacer layer, according to an embodiment of the invention.
Figure 3A:
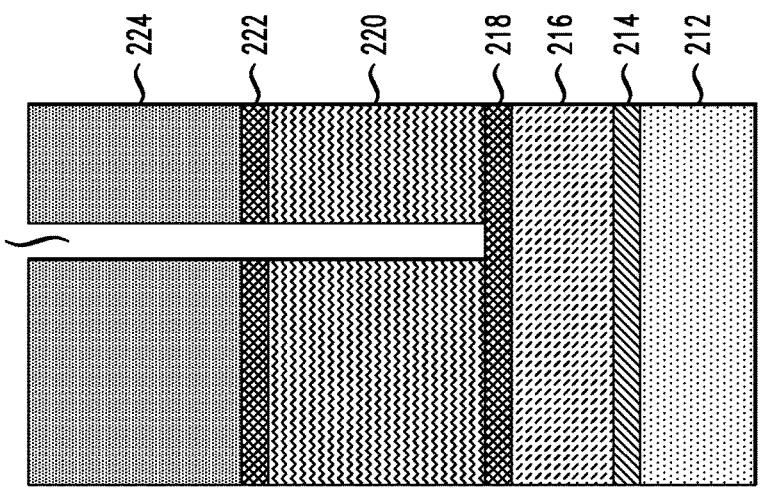

FIGS. 3A and 3B are schematic cross-sectional and top views, respectively, illustrating manufacturing of a junction FET and showing removal of certain layers down to a bottom spacer layer, according to an embodiment of the invention. Referring to FIGS. 3A and 3B, an etch process, such as, for example, an anisotropic etch process, including, but not limited to, a reactive ion etch (RIE) process selective to the bottom spacer layer 218, is performed to form trench 226 through the oxide layer 224, top spacer layer 222 and sacrificial layer 220 down to the bottom spacer layer 218. The top view illustrated in FIG. 3B shows the remaining portion of oxide layer 224, and the bottom spacer 218 viewed through trench 226.

Figure 4B:
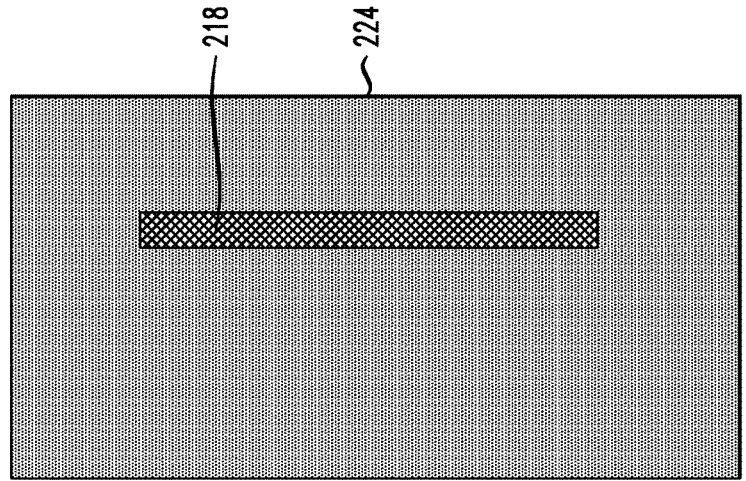
FIGS. 4A and 4B are schematic cross-sectional and top views, respectively, illustrating manufacturing of a junction FET and showing oxide formation on a portion of a sacrificial layer, according to an embodiment of the invention.
Figure 4A:
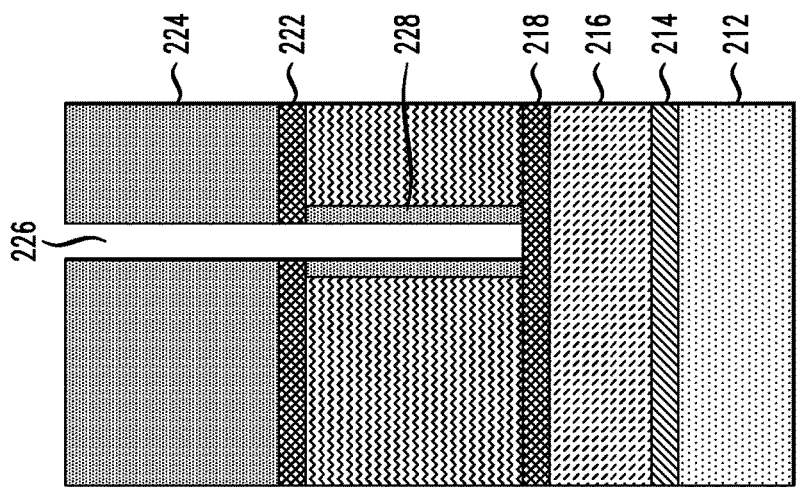

FIGS. 4A and 4B are schematic cross-sectional and top views, respectively, illustrating manufacturing of a junction FET and showing oxide formation on a portion of a sacrificial layer, according to an embodiment of the invention. As illustrated in FIGS. 4A and 4B, a thin oxide 228 is formed on the exposed surface of the sacrificial layer 220 exposed by trench 226, between the top and bottom spacers 222 and 218, respectively. Plasma or another method of oxidation, may be utilized to form the thin oxide layer on the exposed surfaces of the sacrificial layer 220. During subsequent growth of channel material described herein, the oxide 228 prevents lateral growth of channel material, so that channel material can be epitaxially grown in a bottom-up process from the source/drain layer 216.

Figure 5B:
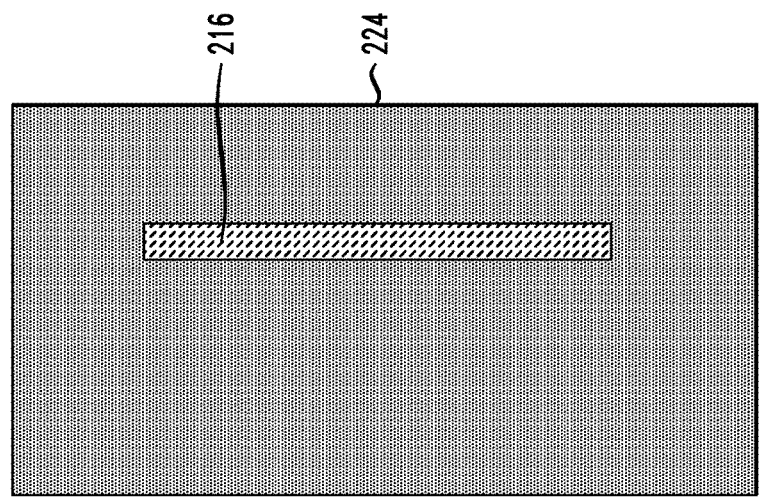
FIGS. 5A and 5B are schematic cross-sectional and top views, respectively, illustrating manufacturing of a junction FET and showing removal of a portion of a bottom spacer, according to an embodiment of the invention.
Figure 5A:
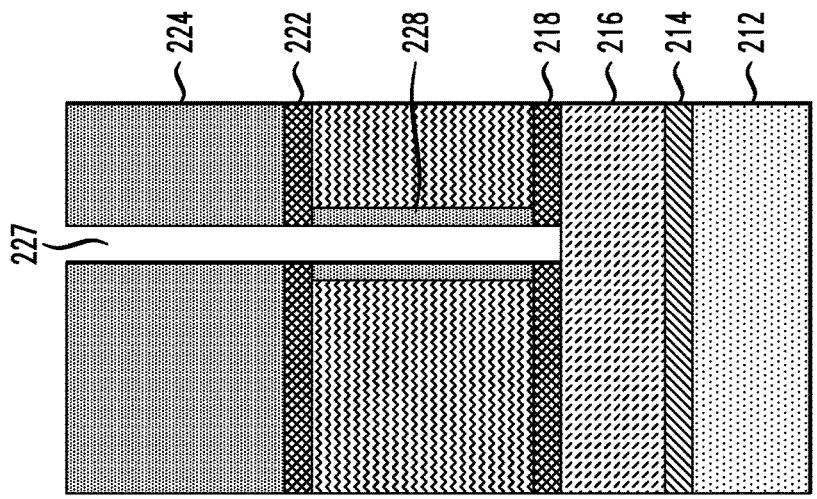

Referring to FIGS. 5A-5B, following the formation of the oxide 228, trench 226 is further etched, using, for example, ME, through the bottom spacer 218 selective to the heavily doped source/drain layer 216 to form trench 227, which is deeper than trench 226, providing a self-aligned junction to a source.

Figure 6B:
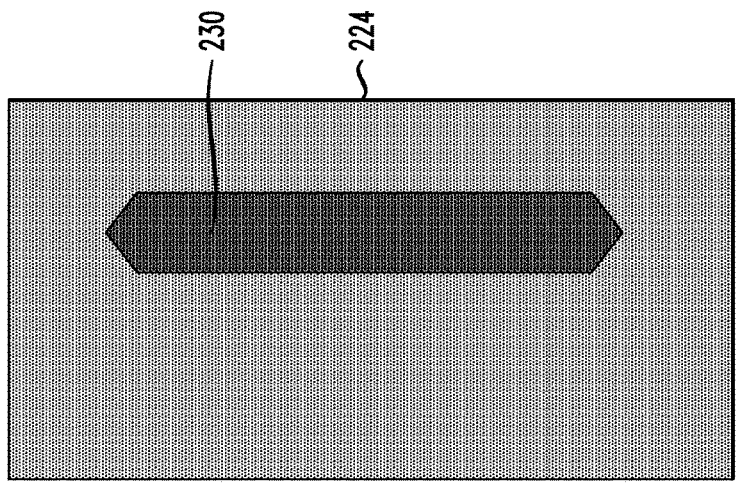
FIGS. 6A and 6B are schematic cross-sectional and top views, respectively, illustrating manufacturing of a junction FET and showing epitaxial growth of a channel region, according to an embodiment of the invention.
Figure 6A:
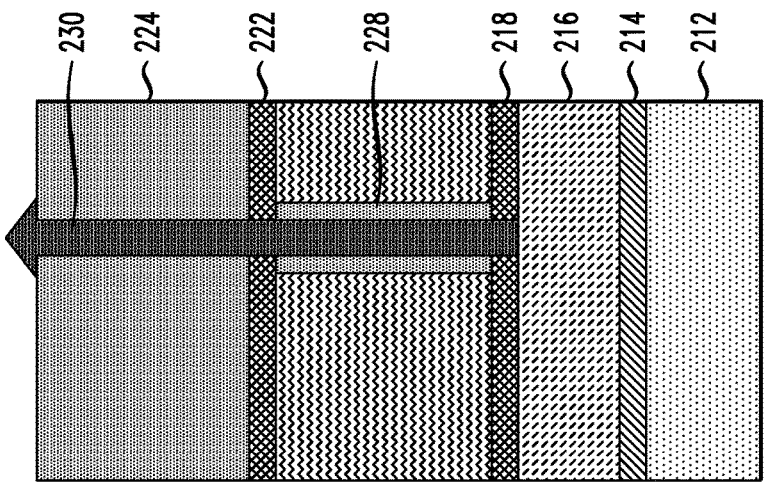
Figure 7B:
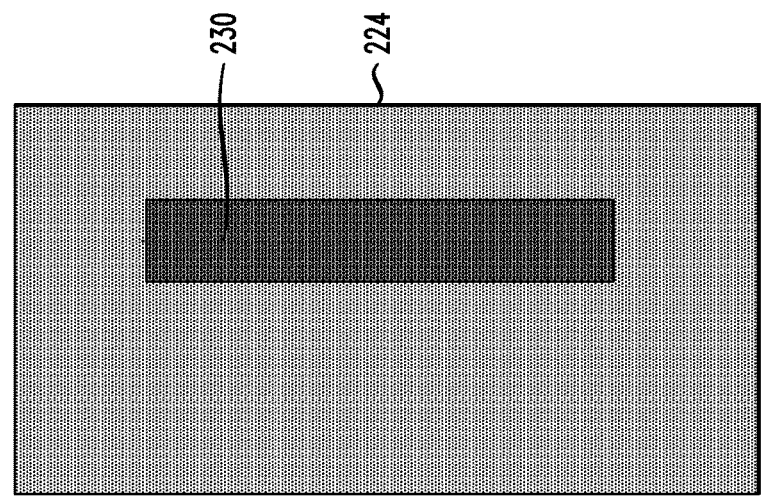
FIGS. 7A and 7B are schematic cross-sectional and top views, respectively, illustrating manufacturing of a junction FET and showing polishing of epitaxial overgrowth, according to an embodiment of the invention.
Figure 7A:
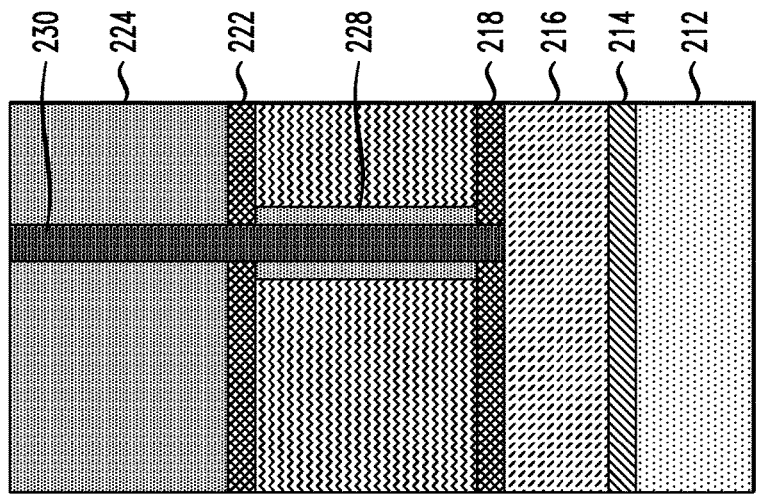

FIGS. 6A and 6B are schematic cross-sectional and top views, respectively, illustrating manufacturing of a junction FET and showing epitaxial growth of a channel region 230, according to an embodiment of the invention. The channel 230 can include, but is not necessarily limited to, silicon (Si), silicon germanium (SiGe), or other semiconductor material. An overgrowth of the channel material may form above the top surface of the oxide layer 224 during the epitaxial growth process. Referring to FIGS. 7A and 7B, the overgrowth may be removed by polishing the surface back to the oxide using, for example, chemical mechanical planarization (CMP).

Figure 8B:
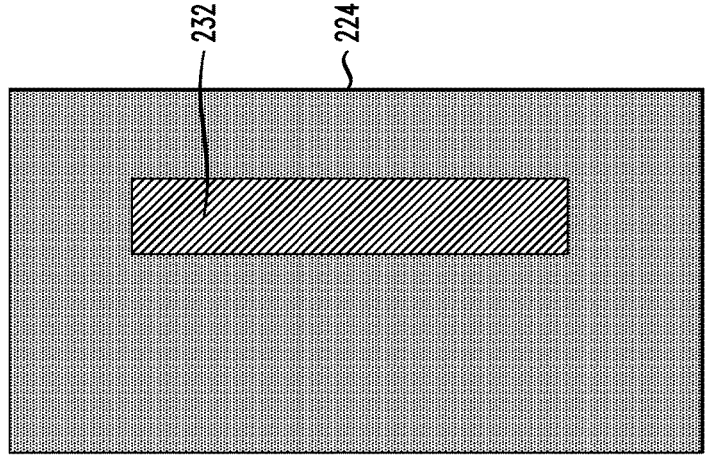
FIGS. 8A and 8B are schematic cross-sectional and top views, respectively, illustrating manufacturing of a junction FET and showing recessing of a portion of the channel region and filling with a dielectric material, according to an embodiment of the invention.
Figure 8A:
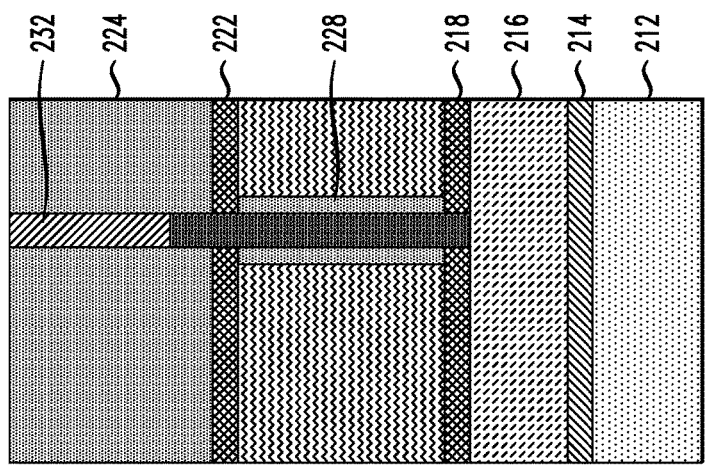

FIGS. 8A and 8B are schematic cross-sectional and top views, respectively, illustrating manufacturing of a junction FET and showing recessing of a portion of the channel region and filling with a dielectric material, according to an embodiment of the invention. As illustrated in FIG. 8A, a top portion of the epitaxial channel material 230 is recessed into the oxide layer 224 in trench 226. Recessing is performed to a level in the oxide layer 224 above the top spacer 222 using, for example, an etching process, such as for example, directional ME, wet etch or a combination of both. The vacant portion left by the recess is filled with a dielectric material, such as, for example, a nitride layer 232, including, but not necessarily limited to, SiN, SiBCN and/or SiOCN. The nitride layer 232 is formed by deposition techniques including, but not limited to, CVD, PECVD, RFCVD, PVD, ALD, MLD, MBD, PLD, LSMCD, and/or sputtering. Any excess nitride formed above the top surface of oxide 224 is removed utilizing a planarization process, such as CMP, for example.

Figure 9B:
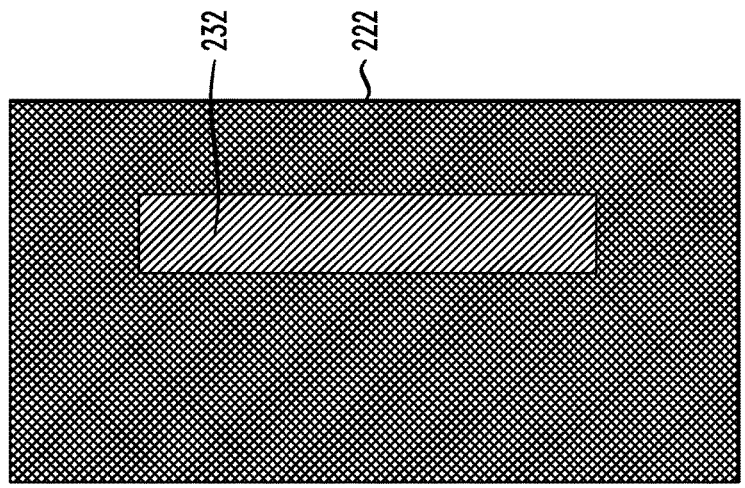
FIGS. 9A and 9B are schematic cross-sectional and top views, respectively, illustrating manufacturing of a junction FET and showing removal of an oxide layer, according to an embodiment of the invention.
Figure 9A:
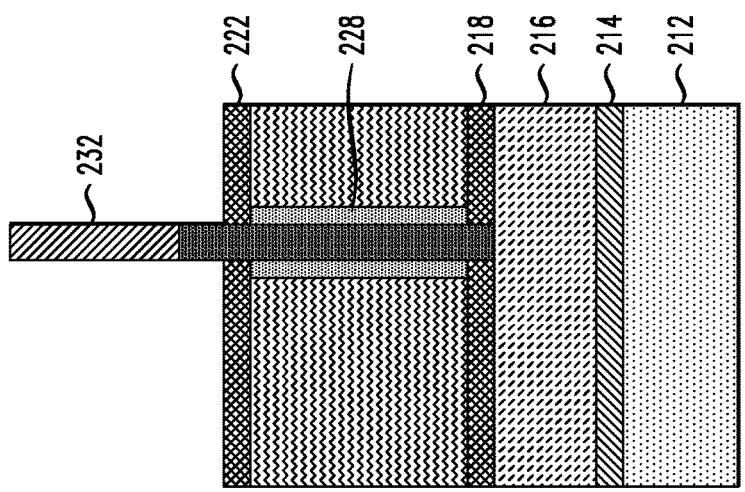

Referring to FIGS. 9A and 9B, the remaining oxide layer 224 is removed, exposing the top surface of top spacer layer 222, as well as side portions of the nitride layer 232 and of channel layer 230 above the top surface of top spacer layer 222. An etch process selectively removing the oxide 224 with respect to the nitride layer 232 and channel region 230 can be performed down to the top spacer layer 222. The top view illustrated in FIG. 9B shows the remaining top spacer layer 222 and the remaining nitride layer 232. The etch process can include, but is not necessarily limited to, directional ME, wet etch or a combination of both.

Figure 11B:
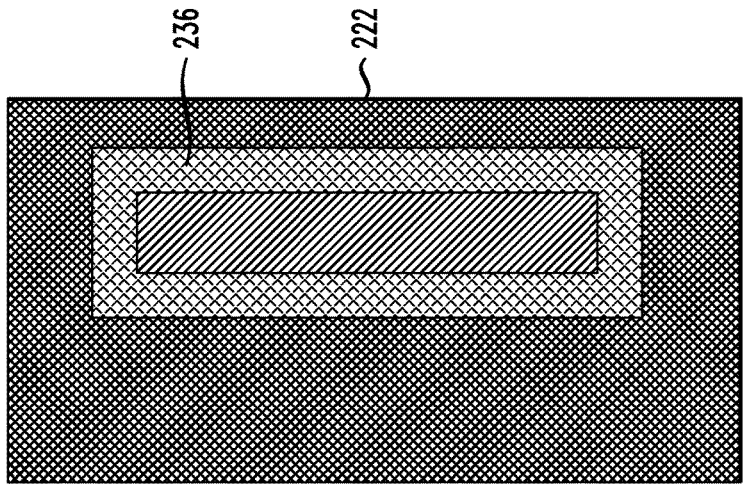
FIGS. 11A and 11B are schematic cross-sectional and top views, respectively, illustrating manufacturing of a junction FET and showing formation of a spacer protecting the top source/drain region, according to an embodiment of the invention.
Figure 11A:
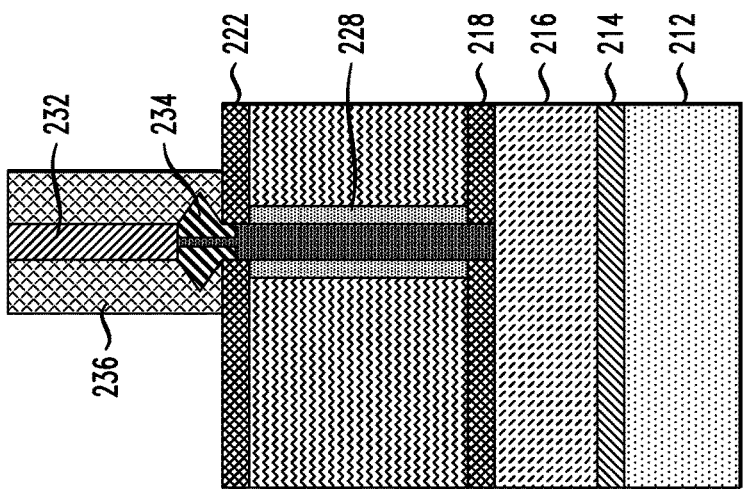

Following the removal of oxide layer 224, referring to FIGS. 10A and 10B, a top source/drain region 234 is formed on a top portion of channel 230 by epitaxial growth. Following the epitaxial growth of the source/drain region 234, referring to FIGS. 11A and 11B, a nitride spacer 236 including, but not necessarily limited to, SiN, SiBCN and/or SiOCN, is formed on the top spacer layer 222 and around top source/drain region 234, and nitride layer 232 to protect the top source/drain region 234 during subsequent etching as described herein. The nitride spacer 236 is deposited using, for example, directional deposition techniques, including, but not necessarily limited to a CVD or PVD nitride deposition followed by spacer etch.

Figure 12B:
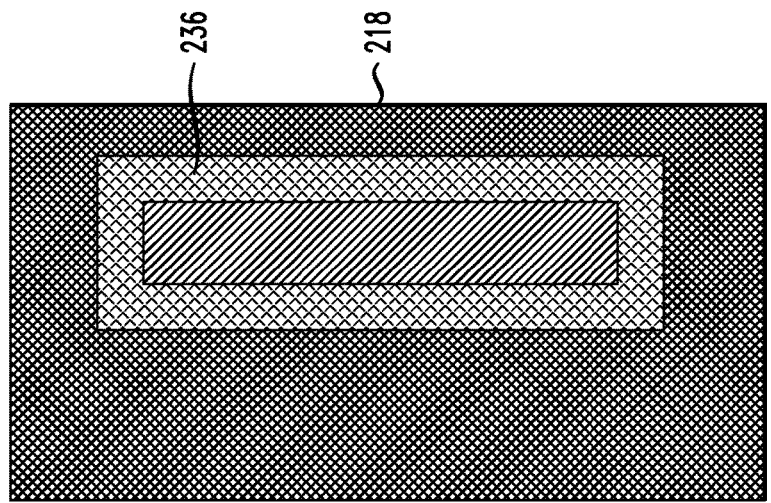
FIGS. 12A and 12B are schematic cross-sectional and top views, respectively, illustrating manufacturing of a junction FET and showing removal down to the bottom spacer of layers not covered by the spacer protecting the top source/drain region, according to an embodiment of the invention.
Figure 12A:
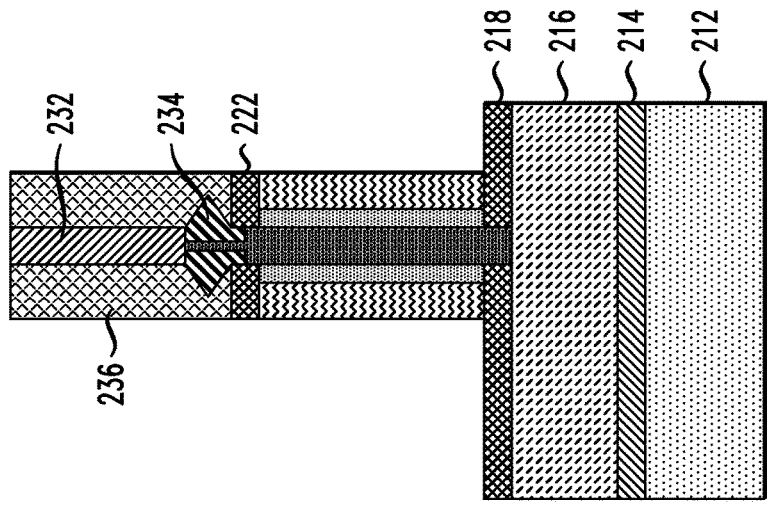

FIGS. 12A and 12B are schematic cross-sectional and top views, respectively, illustrating manufacturing of a junction FET and showing removal down to the bottom spacer 218 of layers not covered by the spacer 236, according to an embodiment of the invention. Referring to FIGS. 12A and 12B, an etch process, such as for example ME, is used to remove portions of the top spacer 222 and sacrificial material 220 not covered by spacer 236, which functions as a hard mask during the etching.

Figure 13B:
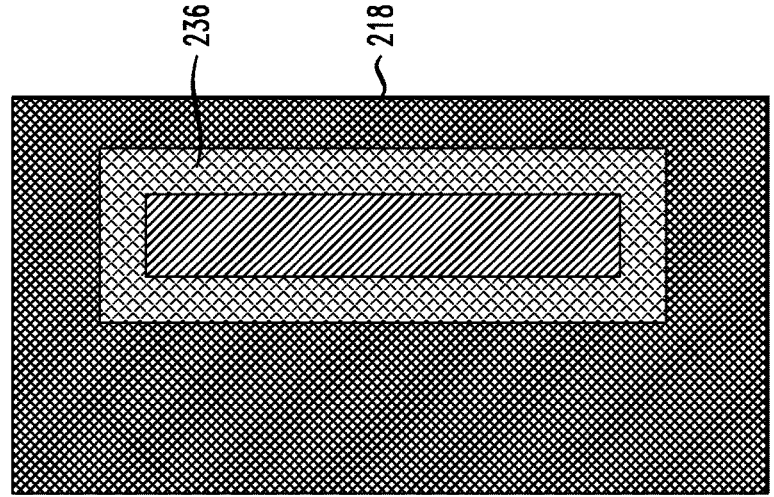
FIGS. 13A and 13B are schematic cross-sectional and top views, respectively, illustrating manufacturing of a junction FET and showing removal of a remaining portion of sacrificial material, according to an embodiment of the invention.
Figure 13A:
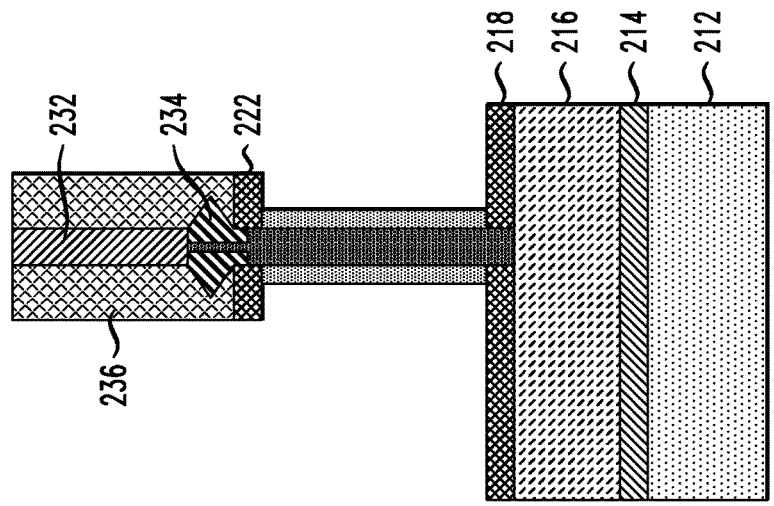

Referring to FIGS. 13A and 13B, following the etching process described in connection with FIGS. 12A and 12B, the remainder of the sacrificial material 220 is removed, using, for example, an etching process that selectively removes the sacrificial material 220 (e.g., silicon) with respect to, for example, nitride, which can be the material of the spacer layers 236, 222 and 218.

Figure 14B:
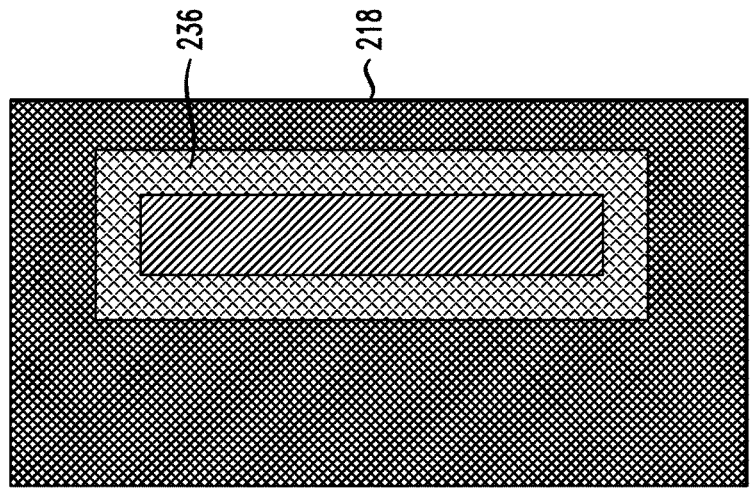
FIGS. 14A and 14B are schematic cross-sectional and top views, respectively, illustrating manufacturing of a junction FET and showing removal of an oxide on a channel sidewall, according to an embodiment of the invention.
Figure 14A:
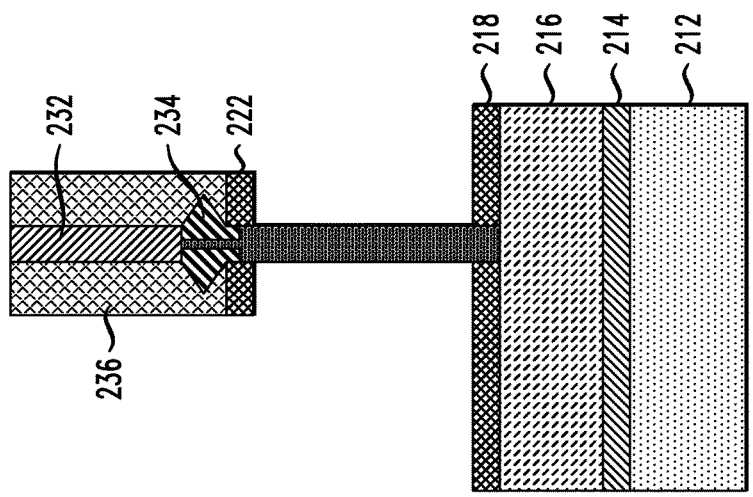

Referring to FIGS. 14A and 14B, following the removal of sacrificial material 220, the oxide 228 on the channel sidewall is removed using, for example, a SiCoNi epitaxial pre-cleaning process performed prior to gate on channel epitaxy described in connection with FIGS. 15A and 15B. A SiCoNi pre-clean can include a plasma-based cleaning chemistry to gently remove oxide at temperatures, for example, less than about 130° C. The SiCoNi pre-clean can include simultaneous exposure to $H_2$, $NF_3$ and $NH_3$ plasma by-products. The SiCoNi pre-clean process is largely conformal and selective towards silicon oxide layers but does not readily etch silicon regardless of whether the silicon is amorphous, crystalline or polycrystalline.

Figure 15B:
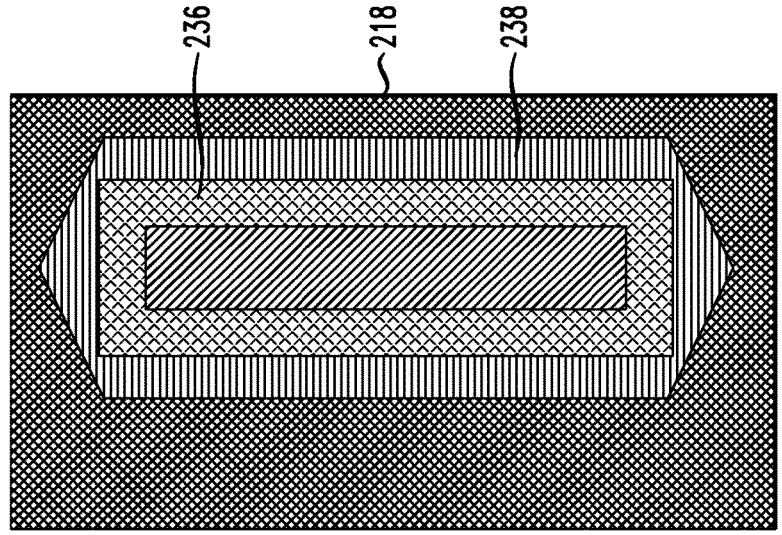
FIGS. 15A and 15B are schematic cross-sectional and top views, respectively, illustrating manufacturing of a junction FET and showing formation of a gate region, according to an embodiment of the invention.
Figure 15A:
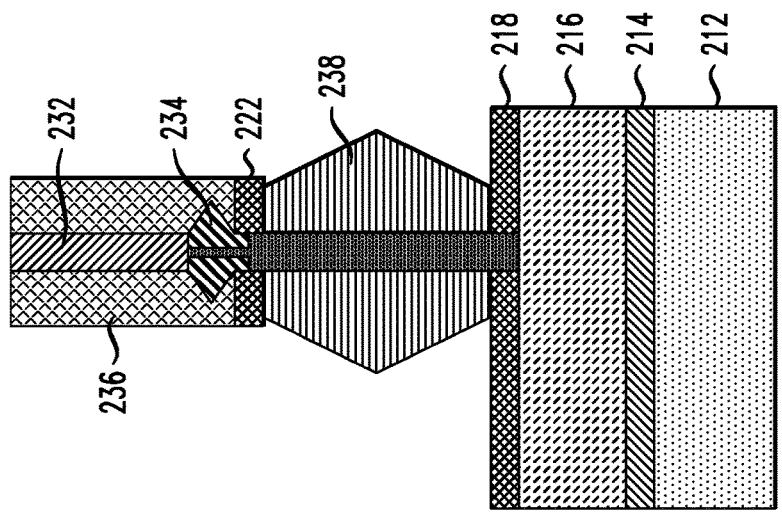

FIGS. 15A and 15B are schematic cross-sectional and top views, respectively, illustrating manufacturing of a junction FET and showing formation of a gate region, according to an embodiment of the invention. Referring to FIGS. 15A and 15B, an all-around gate 238 is formed on the channel region 230. The gate region 238 can be formed by a gate on channel epitaxy process, where highly doped semiconductor material forming the gate is epitaxially grown onto the outer surface of the channel region 230. Referring to FIG. 15A, given a channel surface having <110> oriented planes, a diamond shaped epitaxial gate structure will form, which is bound by <111> oriented planes. In other embodiments, dual- or tri-gate structures can be formed as an alternative to all-around gates.

The epitaxially grown gate region 238 can be in-situ doped during epitaxial growth processes, and dopants may include, for example, an n-type dopant selected from a group V element hydride including, but not limited to, arsine ($AsH_3$), and phosphine ($PH_3$), and a p-type dopant selected from a group III element hydride, including, but not limited to, borane and diborane gas at various concentrations. For example, in a non-limiting example, a dopant concentration range may be e19/cm3 to e20/cm3. The gate region 238 can include, but is not necessarily limited to, silicon (Si), silicon germanium (SiGe), or other semiconductor material.

As noted hereinabove, the channel region 230, as well as the source/drain regions 216 and 234, are doped with a first type doping, which may be either a p-type doping or an n-type doping. The gate region 238 is doped with a second type doping, which may be either an n-type doping or a p-type doping, opposite to the doping of the channel region 230, and the source/drain regions 216 and 234. A pn junction between the gate and the channel is thereby formed. In one embodiment, a p-channel junction FET is formed when the channel, source and drain are p-type doped and the gate is n-type doped. In another embodiment, an n-channel junction FET is formed when the channel, source and drain are n-type and the gate is p-type doped.

In addition, relative to each other in terms of concentration, in accordance with an embodiment of the present invention, the top and bottom source/drain regions 234 and 216 can be more heavily doped than the gate region 238, and the gate region 238 can be more heavily doped than the channel region 230. For example, a resulting structure (see, e.g., FIGS. 19A and 19B) can have heavily doped (e.g., p++) source/drain regions 234 and 216, a highly doped (e.g., n+) gate region, and a low doped (e.g., p) channel region 230.

FIGS. 16A and 16B are schematic cross-sectional and top views, respectively, illustrating manufacturing of a junction FET and showing formation of an inter-layer dielectric (ILD) layer, according to an embodiment of the invention. Referring to FIGS. 16A and 16B, the space around the junction FET structure, above the bottom spacer 218, is filled with an ILD layer 240. The ILD layer 240 can be deposited using deposition techniques including, but not limited to, CVD, PECVD, RFCVD, PVD, ALD, MLD, MBD, PLD, LSMCD, and/or sputtering, followed by planarization by, for example, CMP, down to the nitride layer 232. The ILD layer 240 can include, but is not necessarily limited to, silicon dioxide ($SiO_2$), low-temperature oxide (LTO), high-temperature oxide (HTO), field oxide (FOX) or some other dielectric.

Figure 17B:
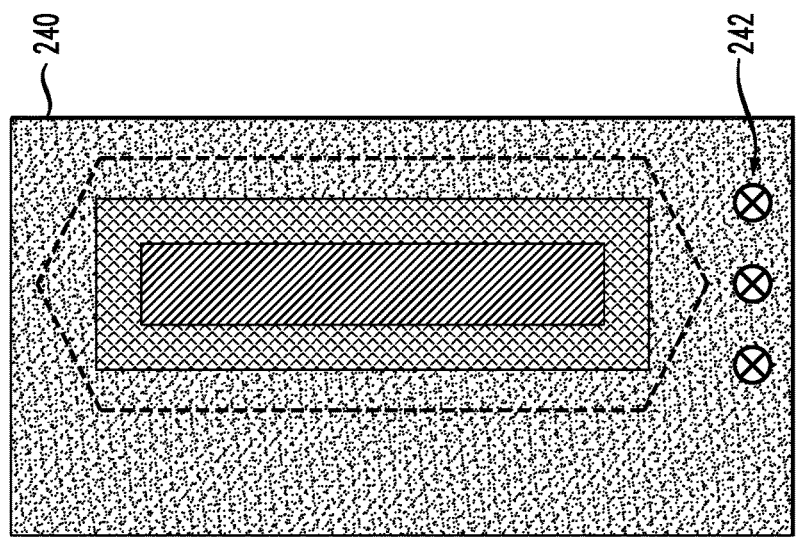
FIGS. 17A and 17B are schematic cross-sectional and top views, respectively, illustrating manufacturing of a junction FET and showing formation of source/drain contacts, according to an embodiment of the invention.
Figure 17A:
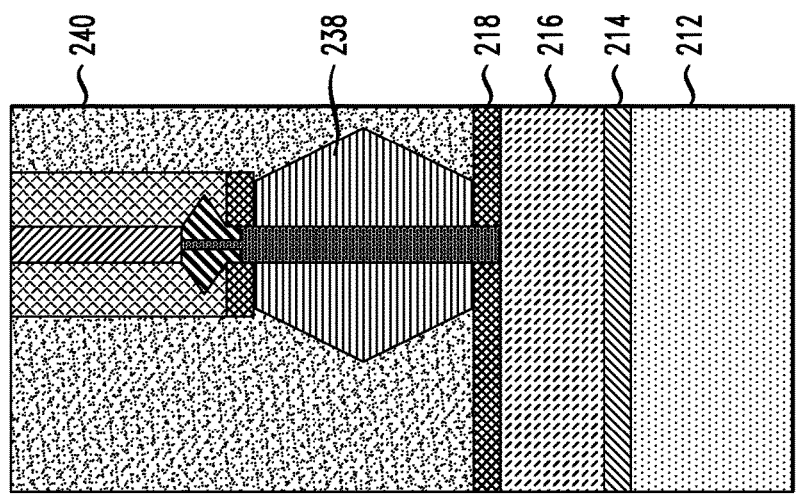
Figure 18A:
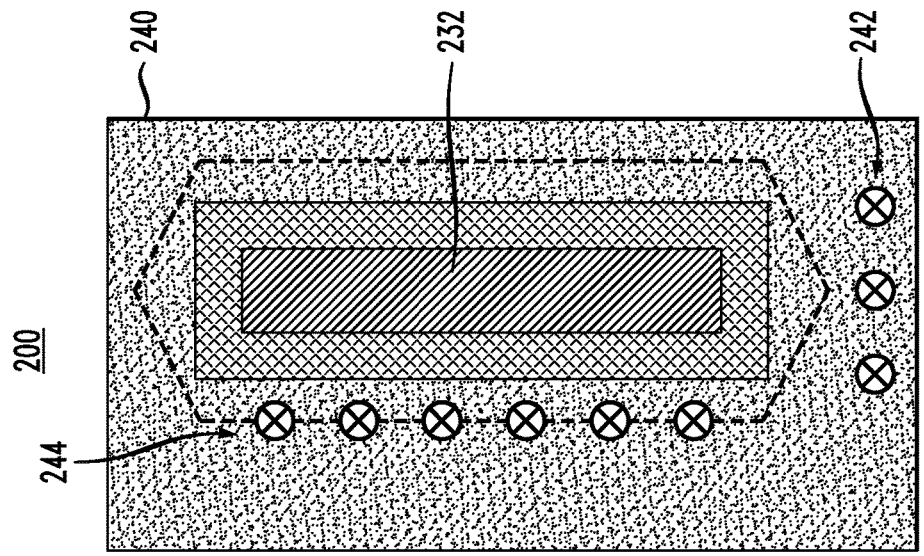
FIGS. 18A and 18B are schematic cross-sectional and top views, respectively, illustrating manufacturing of a junction FET and showing formation of gate contacts, according to an embodiment of the invention.
Figure 18B:
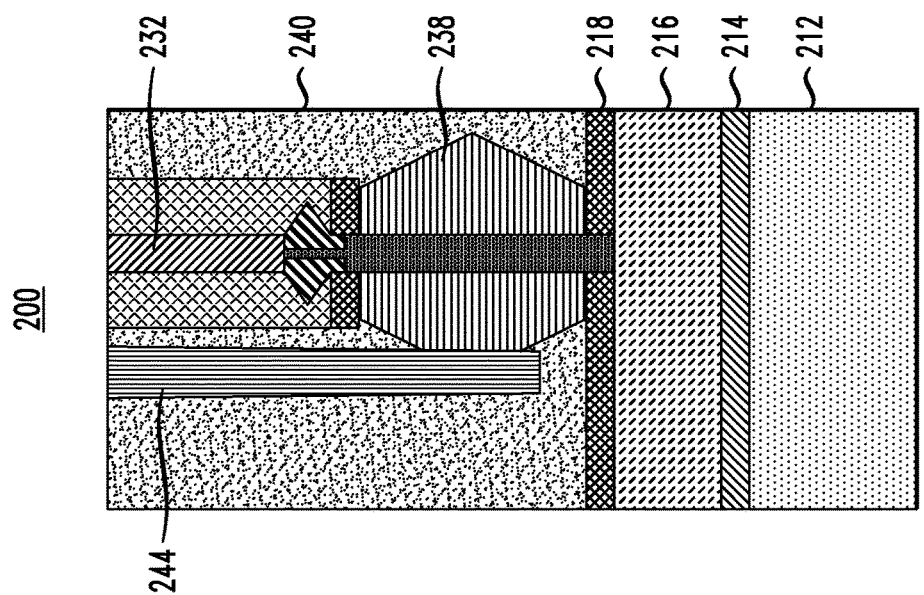

FIGS. 17A, 17B, 18A, 18B, 19A and 19B illustrate formation of source, gate and drain contacts, respectively. For example, FIG. 17B shows source contacts 242 in the top view. Source contacts 242 are in contact with the source/drain region 216. The source contacts 242 can be formed by etching trenches through the ILD layer 240 and bottom spacer layer 218 to reach the source/drain layer 216, and then filling the trenches with a contact material, such as, for example, electrically conductive material including, but not necessarily limited to, tungsten, cobalt, zirconium, tantalum, titanium, aluminum, ruthenium, and/or copper. In a similar manner to forming the source contacts 242, gate contacts 244 are formed by formation of one or more trenches through the ILD layer 240 to expose a portion of the gate 238. The trenches are filled with an electrically conductive material to form the gate contacts 244 as illustrated in FIGS. 18A and 18B. A silicide/germanide layer may be formed in the trenches by, for example, silicidation (e.g., formation of an alloy including a portion of a contact material with an underlying silicon or germanium layer), before filling the trenches with a remainder of electrically conductive material.

Figure 19A:
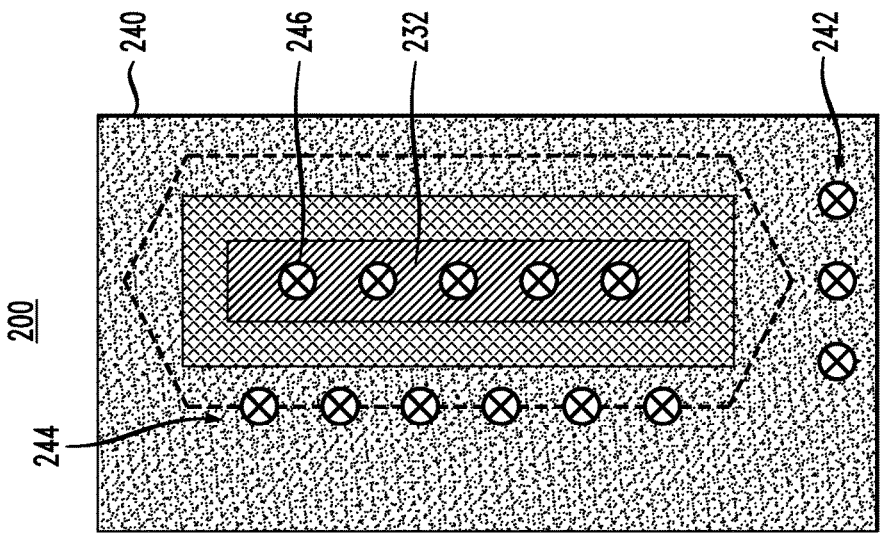
FIGS. 19A and 19B are schematic cross-sectional and top views, respectively, illustrating manufacturing of a junction FET and showing formation of source/drain contacts, according to an embodiment of the invention.
Figure 19B:
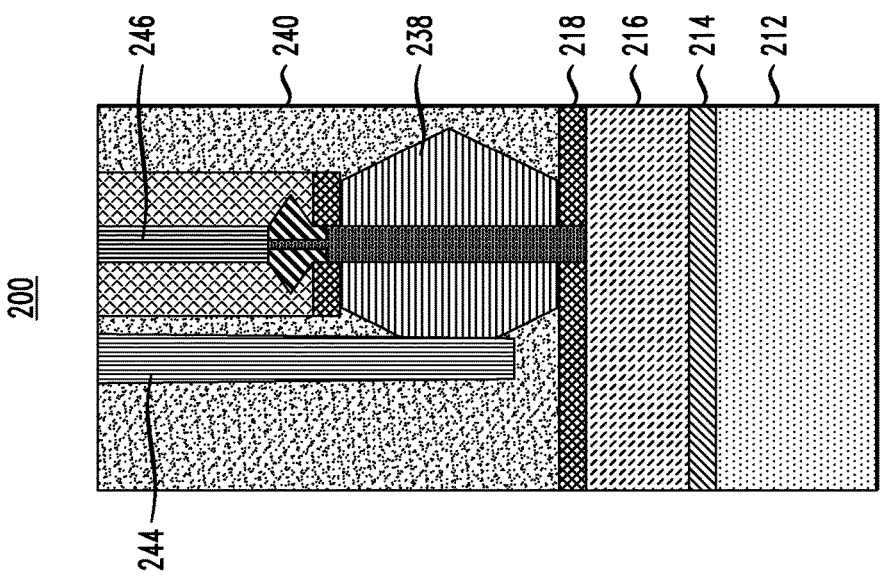

Referring to FIGS. 19A and 19B, the drain contacts 246 are formed by removing portions of the nitride layer 232 to create trenches in the nitride layer 232 and filling the trenches with electrically conductive contact material to form drain contacts 246 contacting top source/drain region 234. As noted above, a silicide/germanide layer may be formed in the trenches before filling the trenches with a remainder of electrically conductive material.

The contacts 242, 244, 246 can be formed simultaneously, or in separate steps. In the case of all-around gate regions, a single gate contact may be sufficient since the gate region is continuous all-around a channel region.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of manufacturing a semiconductor device, comprising:
    forming a bottom source/drain region on a semiconductor substrate;
    forming a channel region extending vertically from the bottom source/drain region;
    growing a top source/drain region from an upper portion of the channel region;
    growing a gate region from a lower portion of the channel region under the upper portion; and
    forming a counter doped layer between the bottom source/drain region and the semiconductor substrate;
    wherein the gate region is on more than one side of the channel region.

2. The method according to claim 1, wherein the gate region surrounds the channel region on all sides.

3. The method according to claim 1, further comprising forming a bottom spacer between the bottom source/drain region and the gate region.

4. The method according to claim 3, further comprising forming a top spacer between the top source/drain region and the gate region.

5. The method according to claim 1, wherein growing the top source/drain region comprises epitaxial growth.

6. The method according to claim 1, wherein growing the gate region comprises epitaxial growth.

7. A method of manufacturing a semiconductor device, comprising:
    forming a bottom source/drain region on a semiconductor substrate;
    forming a channel region extending vertically from the bottom source/drain region;
    growing a top source/drain region from an upper portion of the channel region;
    growing a gate region from a lower portion of the channel region under the upper portion;
    forming a sacrificial layer on the bottom source/drain region; and
    forming a trench in the sacrificial layer;
    wherein the gate region is on more than one side of the channel region; and
    wherein forming the channel region comprises epitaxially growing the channel region in the trench.

8. The method according to claim 7, further comprising:
    forming an oxide on exposed portions of the sacrificial layer in the trench prior to epitaxially growing the channel region.

9. The method according to claim 7, further comprising forming an oxide layer on the sacrificial layer, wherein the trench extends through the oxide layer.

10. The method according to claim 9, further comprising recessing a portion of the channel region in the oxide layer.

11. The method according to claim 10, further comprising filling a vacancy left by the recessing by depositing a nitride layer on a remaining portion of the channel region.

12. The method according to claim 11, further comprising removing the oxide layer prior to growing the top source/drain region.

13. The method according to claim 7, further comprising removing the sacrificial layer prior to growing the gate region.

* * * * *